(12) United States Patent
Babecki et al.

(10) Patent No.: US 11,742,867 B2
(45) Date of Patent: Aug. 29, 2023

(54) ANALOG SIGNAL LINE INTERFERENCE MITIGATION

(71) Applicant: Microsoft Technology Licensing, LLC, Redmond, WA (US)

(72) Inventors: Christopher Michael Babecki, Seattle, WA (US); Ryan Scott Haraden, Duvall, WA (US); Jingyang Xue, Sunnyvale, CA (US); Anasuya Vishwas Kulkarni, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 57 days.

(21) Appl. No.: 17/646,641

(22) Filed: Dec. 30, 2021

(65) Prior Publication Data

US 2023/0216514 A1 Jul. 6, 2023

(51) Int. Cl.
*H03M 1/00* (2006.01)
*H03M 1/06* (2006.01)
*G09G 3/22* (2006.01)
*H03M 1/66* (2006.01)

(52) U.S. Cl.
CPC ............ *H03M 1/0602* (2013.01); *G09G 3/22* (2013.01); *H03M 1/66* (2013.01); *G09G 2310/0243* (2013.01)

(58) Field of Classification Search
CPC ........ H03M 1/0602; H03M 1/66; G09G 3/22; G09G 2310/0243; H04B 3/487; H04B 1/0475
See application file for complete search history.

(56) References Cited

U.S. PATENT DOCUMENTS

2020/0067568 A1 2/2020 Spirkl et al.

FOREIGN PATENT DOCUMENTS

| EP | 1410588 A2 | 4/2004 | |
|---|---|---|---|
| WO | 2010099399 A1 | 9/2010 | |
| WO | WO 2016/120020 | * 8/2016 | ............. H04L 27/26 |

OTHER PUBLICATIONS

"International Search Report and Written Opinion Issued in PCT Application No. PCT/US22/044773", dated Jan. 5, 2023, 14 Pages.
"International Search Report and Written Opinion Issued in PCT Application No. PCT/US22/044775", dated Jan. 5, 2023, 13 Pages.

* cited by examiner

*Primary Examiner* — Joseph J Lauture
(74) *Attorney, Agent, or Firm* — Alleman Hall Creasman & Tuttle LLP

(57) ABSTRACT

A method for mitigating interference across analog signal lines includes receiving a digital data stream including a plurality of discrete signal patterns configured to drive a plurality of different analog signal lines. An edge buffer for each analog signal line is populated with edge data representing pulse edges of upcoming signal patterns set to drive the analog signal line. A target buffer for a target signal line is populated with target data representing a target signal pattern. Edge buffers corresponding to potentially interfering analog signal lines are searched to identify potentially interfering pulse edges. A set of potentially interfering pulse edges are selected for interference mitigation, and the target signal pattern is modified to perform preemptive interference mitigation based at least in part on the selected pulse edges.

20 Claims, 10 Drawing Sheets

ANALOG SIGNAL LINE INTERFERENCE MITIGATION

BACKGROUND

Digital-to-analog converters (DACs) can be used to convert digital data streams into analog signals—e.g., to drive an analog output device such as a speaker or light emitter. In some cases, analog signals transmitted over an analog signal line can affect local electrical conditions in a manner that impacts signal transmission on other signal lines.

DETAILED DESCRIPTION

Figure 1:
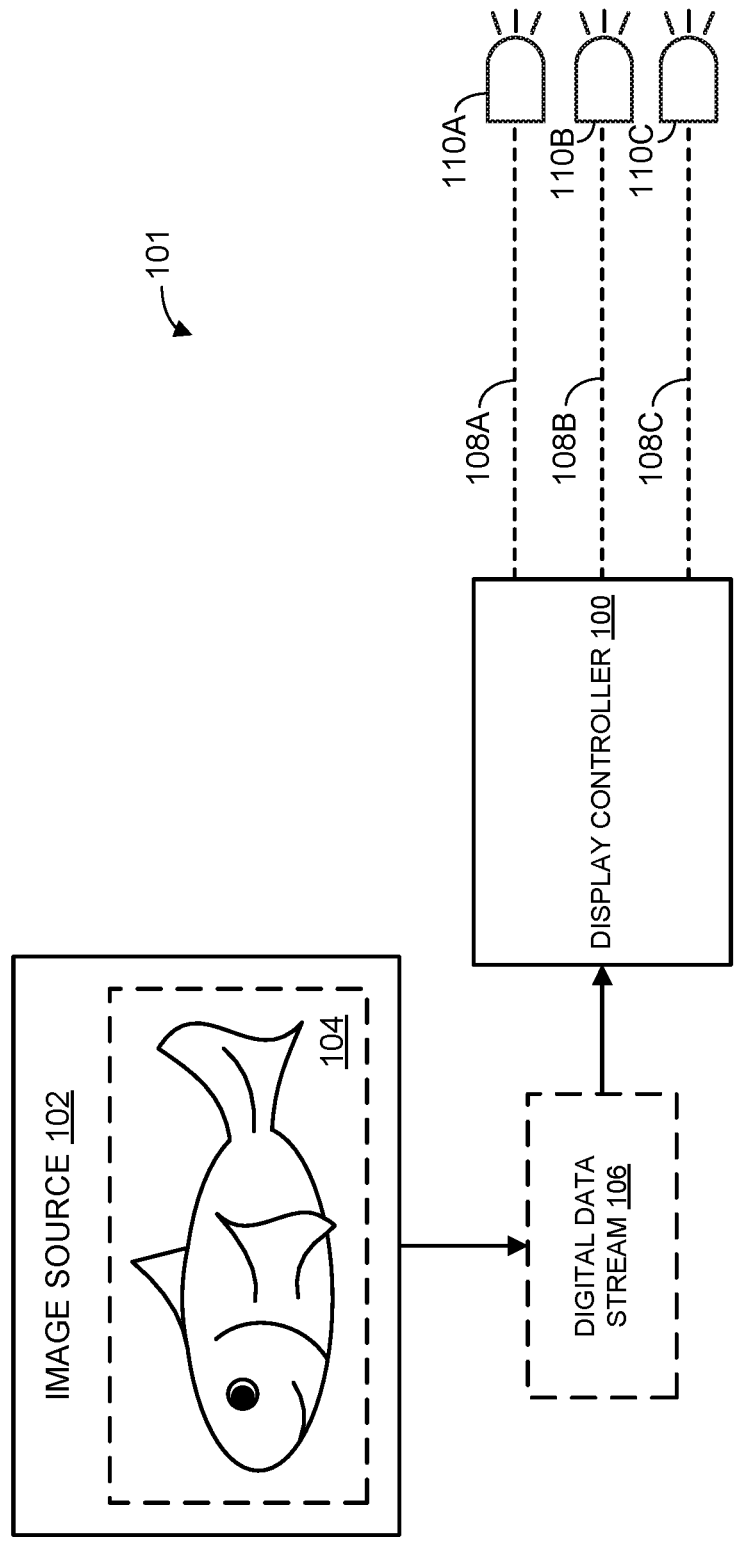
FIG. 1 schematically shows an example electronic display system.

As discussed above, transmission of an analog signal over a signal line can influence local electrical conditions in ways that may have unintended effects on other nearby signal lines. For instance, an analog signal transmitted over a particular analog signal line of interest (e.g., a "target" signal line) may include a plurality of signal pulses where the amplitude of the signal increases or decreases, with a corresponding increase or decrease in electrical current. Such changes in current can cause capacitive coupling and/or inductive coupling with nearby signal lines, thereby changing signals transmitted on the nearby signal lines in unintended ways. For instance, in a case where the analog signals are used to control light emitters (such as lasers), a relatively small change in signal amplitude can correspond to a relatively large change in light output, which can cause undesirable visual artifacts (e.g., a visible rippling effect). Furthermore, transmission of signals on the nearby signal lines may interfere with the target signal line. In other words, transmission of analog signals on any particular analog signal line can interfere with signal transmission on any or all nearby signal lines, and this can ultimately cause degradation of the output signal.

Accordingly, the present disclosure is directed to techniques for mitigating interference across analog signal lines. For a target analog signal line set to be driven with an upcoming target signal pattern (where a "pattern" refers to a discrete sequence of one or more signal pulses), the system may perform preemptive interference mitigation based on signals set to drive other signal lines concurrently with the target signal pattern. This may include buffering edge data corresponding to signal pulse edges that will be used to drive transmission on each analog signal line, then selecting a set of one or more potentially interfering pulse edges for interference mitigation. In another approach (e.g., where driving of different lines is not synchronized), the system may determine whether the different edge buffers include data representing one or more post-target signal edges falling after the target signal pattern, then perform preemptive interference mitigation based on a selected set of potentially interfering signal patterns.

In any case, the techniques described herein provide technical benefits by improving the accuracy with which analog signals are transmitted in an electronic device. This is done by preemptively modifying digital signal data prior to transmission of the analog signal over an analog signal line—e.g., based on an anticipated interference from signals set to be concurrently transmitted on other analog signal lines. In other words, the ability of electronic system to accurately output analog information (e.g., for displaying images, playing audio) may be improved by preemptively modifying digital data based on the unique capabilities and construction of the electronic device.

The present disclosure primarily focuses on mitigating interference across analog signal lines in the context of an electronic display system. In particular, the techniques discussed herein are primarily described as being performed by a display controller. FIG. 1 schematically illustrates an example display controller 100 of a non-limiting electronic display system 101. It will be understood, however, that the example of an electronic display system is only one potential scenario where interference between nearby analog signal lines can negatively affect signal transmission. In other implementations, the techniques described herein may be applied in any variety of different suitable scenarios where two or more analog signal lines are physically near one another and concurrently driven with different signal patterns. In such cases, the herein-described techniques may be implemented by one or more computer logic elements besides a "display controller," without departing from the scope of this disclosure.

In FIG. 1, the display controller is communicatively coupled with an image source 102, which renders a digital image 104 for presentation by electronic display system 101. Display controller 100 receives a digital data stream 106 representing the digital image, then transmits analog signals over a plurality of analog signal lines 108A-108C to control a plurality of light emitters 110A-110C to form pixels of the image. As one non-limiting example, the electronic display system may be part of a head-mounted display device (HMD), such as a mixed reality device. In other examples, the electronic display system may be a component of any other suitable device configured to present computer-generated imagery based on digital information.

Furthermore, it will be understood that the specific arrangement of electronic display system 101 shown in FIG. 1 is highly simplified and intended only as a non-limiting example. In general, an electronic display system (and/or any other electronic system implementing the techniques described herein) may have any capabilities, form factor, and suitable hardware configuration. In some examples, electronic display system 101 may be implemented as computing system 900 described below with respect to FIG. 9.

Both display controller 100 and image source 102 may be implemented as any suitable computer logic components. In general, the present disclosure describes the "display controller" as receiving a digital data stream from another source (e.g., image source 102), then controlling the driving of a plurality of different analog signal lines with different signal patterns to cause transmission of analog signals. In the example of FIG. 1, the digital data corresponds to a digital image rendered by image source 102. For example, the image source may take the form of a graphics processor that renders image frames, then sends data representing the image frames to the display controller for presentation to a user.

In general, the display controller may receive digital image data (and/or other suitable data) from any suitable source, which may be collocated with the display controller as part of the same device, and/or the display controller may receive digital data from a remote source. Furthermore, it will be understood that the display controller may receive digital data from any suitable number of different sources, and perform any suitable operations based on the received data to cause transmission of analog signals over the analog signal lines. In some examples, either or both of display controller 100 and image source 102 may be implemented as logic subsystem 902 described below with respect to FIG. 9.

As will be described in more detail below, after receiving the digital data stream, the display controller may drive a plurality of analog signal channels with a plurality of discrete signal patterns. For example, the display controller may comprise a digital-to-analog converter (DAC) that receives digital signal pattern data as an input and outputs corresponding analog signals. In the example of FIG. 1, signal patterns are used to control light-emitters 110A-110C, which generally may take any suitable form. For instance, the light emitters may be lasers, light-emitting diodes (LEDs), and/or may be other suitable light emitting elements. Control over the light emitters may, for example, enable the electronic display system to present pixels of the digital image for viewing by a human user.

It will be understood that, in practical examples, an electronic display system may include any suitable number of light-emitters, corresponding to different analog signal lines. While only three light-emitters are shown in FIG. 1, this is non-limiting. In another implementation, an electronic display system may, for example, include twelve analog signal lines for twelve different light-emitters, including four light emitters for each primary display color (e.g., red, green, and blue).

Figure 2:
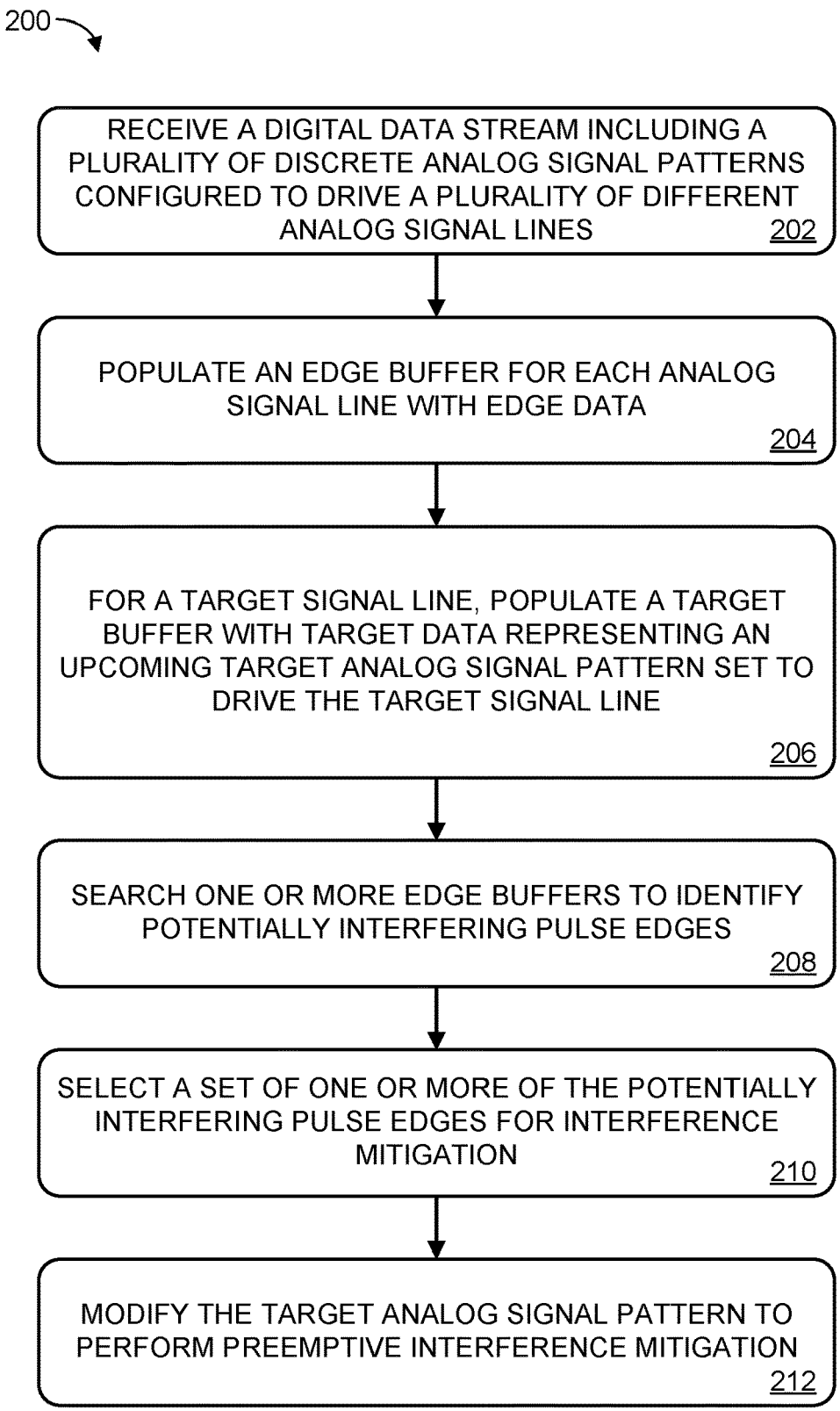
FIG. 2 illustrates an example method for mitigating interference across analog signal lines.

In general, as discussed above, transmission of an analog signal over an analog signal line can affect local electrical conditions in a manner that interferes with signal transmission on other nearby analog signal lines. As such, FIG. 2 illustrates an example method 200 for mitigating interference across analog signal lines. Method 200 may be implemented by a computing system of one or more computing devices. As discussed above, method 200 may in some cases be implemented by a display controller of an electronic display system (e.g., display controller 100 of electronic display system 101). In general, however, any electronic system implementing method 200 may have any suitable capabilities, hardware configuration, and form factor. In some cases, method 200 may be implemented by computing system 900 described below with respect to FIG. 9.

It will be understood that, while the electronic display system ultimately transmits analog signals over analog signal lines as discussed above, the techniques described herein are primarily focused on the digital domain. In other words, prior to any given analog signal being transmitted, the digital data representing the analog signal may be modified in a manner that attempts to mitigate anticipated interference from other analog signal lines. As such, it will be understood that "modifying" a signal pattern refers to modifying a set of digital data corresponding to the signal pattern, before the pattern itself is used to drive transmission of a corresponding analog signal over a signal line. Thus, the analog signal that is ultimately transmitted will differ from the signal specified by the original, unmodified data received by the display controller—e.g., with the expectation that the eventual output of the system (e.g., activation of a light emitter) after the analog signal is affected by interference will be substantially similar to what was specified by the original data.

At 202, method 200 includes receiving a digital data stream including a plurality of discrete signal patterns configured to drive a plurality of different analog signal lines. As used herein, a signal "pattern" refers to a sequence of two or more signal pulses (e.g., positive or negative changes in signal amplitude relative to a baseline), bounded by corresponding pulse edges (e.g., points where the signal amplitude changes).

Figure 3A:
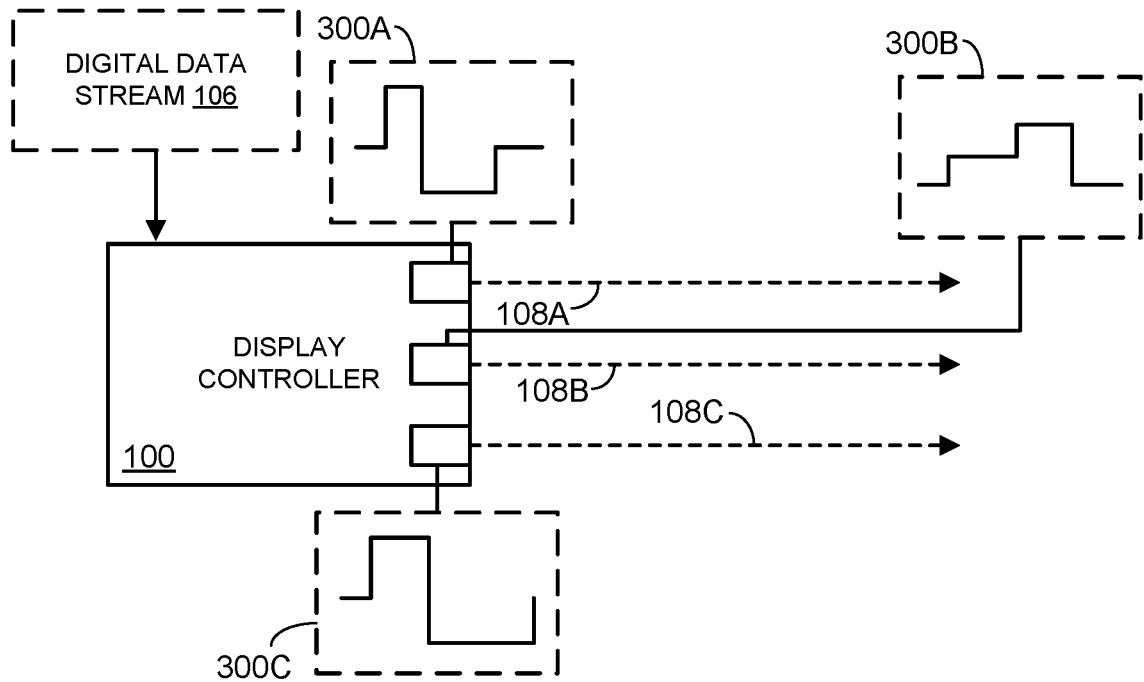
FIGS. 3A and 3B schematically represent signal patterns set to drive analog signal lines.
Figure 3B:
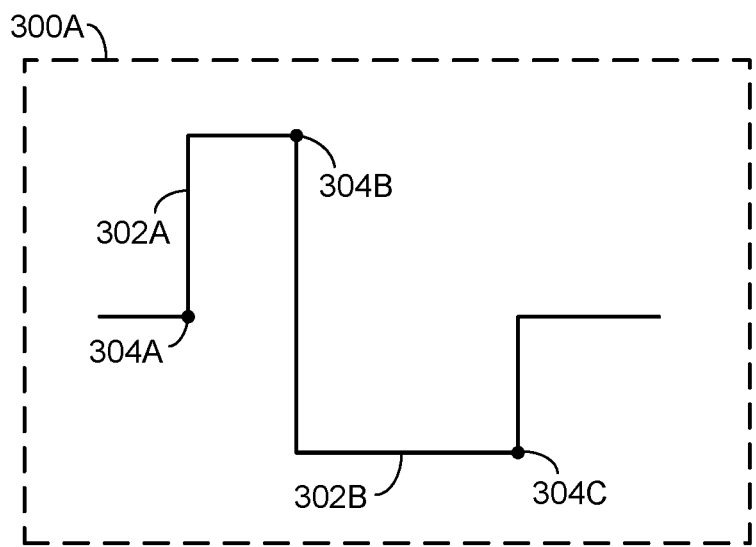

This is schematically illustrated with respect to FIGS. 3A and 3B. Specifically, FIG. 3A again schematically shows display controller 100 receiving digital data stream 106. As discussed above, the digital data stream may include a representation of a digital image, and digital signal patterns of the digital data stream may be used to control a plurality of light emitters to display pixels of the digital image, as one non-limiting example. For instance, the digital data may express an intensity value (e.g., an 8-bit intensity value) for a given light emitter, and a corresponding signal pattern may cause circuitry of the light emitter to emit light with the specified intensity.

However, for the purposes of this disclosure, the display controller receives digital data including signal pattern data, and drives the analog signal lines with corresponding signals patterns to cause transmission of analog signals, regardless of the specific type of digital data received, and regardless of the purpose of the signal patterns. The digital data may be converted into the analog signals in any suitable way. As discussed above, the display controller may in some cases include or interface with a DAC configured to output analog signals from digital data.

As shown in FIG. 3A, three different signal patterns set to drive the three analog signal lines, including patterns 300A, 300B, and 300C. FIG. 3B schematically represents signal pattern 300A in more detail. As shown, pattern 300A includes two signal pulses 302A (e.g., a positive change in signal amplitude) and 302B (e.g., a negative change in signal amplitude). The signal pulses are bounded by pulse edges 304A, 304B, and 304C—e.g., points within the signal pattern where the signal amplitude changes. As will be described in more detail below, the digital data representing patterns 300A-C may be modified before the data is actually used to drive the analog signal lines and cause transmission of analog signals—e.g., to preemptively correct for anticipated signal interference.

It will be understood that the specific signal patterns 300A, 300B, and 300C shown in FIGS. 3A and 3B, as well as other signal patterns depicted in other FIGS. herein, are deliberately simplified and used only for the sake of example. In practical scenarios, it will be understood that signal patterns may take any variety of suitable forms, having different lengths, numbers of pulses, pulse edges, pulse characteristics (e.g., square, sinusoidal, sawtooth), etc. In some cases, the electronic display system (or other electronic system implementing the techniques described herein) may limit the variety of supported signal patterns—e.g., the electronic display system may use four different pattern profiles (or another suitable number of profiles), where different patterns fitting the same profile may vary in amplitude. This may beneficially reduce the computational load associated with generating and/or interpreting signal patterns. Furthermore, in some cases, the size of each pattern (e.g., in terms of temporal length) may range between a minimum practical value (e.g., corresponding to signal response of an associated output device, such as a laser), and a maximum selected value. The maximum selected value may vary depending on the specific implementation.

Returning briefly to FIG. 2, at 204, method 200 includes, for each of the plurality of different analog signal lines, populating an edge buffer corresponding to the analog signal line with edge data. The edge data represents pulse edges of one or more upcoming signal patterns set to drive the analog signal line. As will be discussed in more detail below, this may enable identification of potentially interfering pulse edges—e.g., those that are set to drive one or more signal lines concurrently with driving of a different signal line with a target signal pattern.

Figure 4:
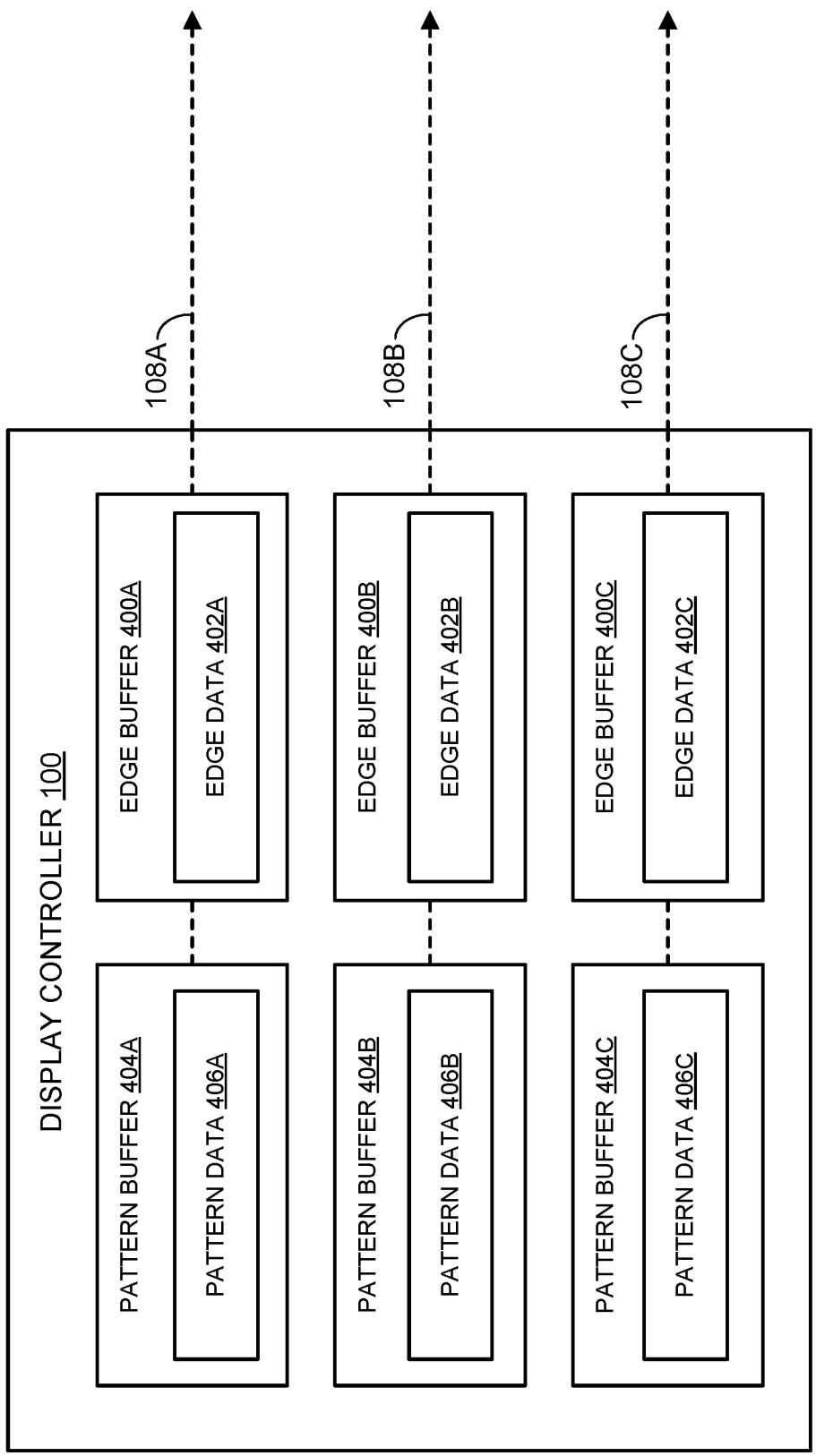
FIG. 4 schematically represents data buffers associated with different analog signal lines.

This is illustrated with respect to FIG. 4, which again schematically depicts display controller 100 and analog signal lines 108A-108C. In FIG. 4, each of analog signal lines 108A-108C is associated with a respective edge buffer 400A, 400B, and 400C. Each edge buffer is populated with respective edge data 402A, 402B, and 402C. The edge data generally represents pulse edges of one or more upcoming signal patterns set to drive each respective analog signal line. For example, the edge data stored in each edge buffer may comprise, for pulse edges of each of the one or more upcoming signal patterns set to drive the analog signal line corresponding to the edge buffer, a timestamp associated with the pulse edge and a signal magnitude change associated with the pulse edge. Timestamps may be expressed relative to a common reference time—e.g., maintained by the display controller. Notably, the timestamps may be in the future relative to the moment at which the edge buffer is populated with edge data for a given pulse edge, as the analog signal corresponding to the signal pattern has not yet been transmitted over the signal line.

The edge buffers may be implemented in any suitable way. Each edge buffer may have a fixed or variable size, and each edge buffer need not have the same size. In one example, each edge buffer may have a maximum size derived at least in part from a maximum supported pulse width (wMax) and a minimum supported pulse width (wMin) of the electronic display system. For example, the maximum size of each edge buffer (e.g., expressed in pulse edges) may be calculated by:

$$2 * \left(\frac{wMax}{wMin}\right) + 1$$

In some examples, each edge buffer may be a circular buffer. For example, if an edge buffer is filled with edge data, the oldest edge data may be removed and replaced with incoming new edge data. In other words, edge buffers may use a first in, first out (FIFO) model. Furthermore, in some cases, the edge data may be stored in each edge buffer in a searchable format—e.g., enabling the display controller to retrieve data corresponding to any particular pulse edge regardless of its position within the overall buffer. It will be understood, however, that edge buffers may be implemented in any variety of suitable ways, depending on the implementation.

Returning briefly to FIG. 2, at 206, method 200 includes, for a target signal line of the plurality of analog signal lines, populating a target buffer with target data representing an upcoming target signal pattern set to drive the target signal line. The present disclosure uses the term "target signal pattern" to refer to a particular signal pattern to which preemptive interference mitigation will be applied, in an attempt to compensate for interference originating from transmission of signals on other analog signal lines. In turn, the analog signal line that the target signal pattern is set to drive is referred to as a "target signal line."

As discussed above, however, transmission of analog signals over any particular analog signal line may interfere with signal transmission over any or all of the other analog signal lines of the electronic display system. Thus, the techniques described herein need not be limited to only performing interference mitigation for a single analog signal line, or a single signal pattern used to drive that analog signal line. Rather, preemptive interference mitigation may be performed for each analog signal line of the system, concurrently or sequentially. In other words, the electronic system implementing method 200 may perform preemptive interference mitigation for any or all of the plurality of analog signal lines by separately identifying each of the plurality of analog signal lines as the target signal line. Different respective target signal patterns for each of the plurality of analog signal lines may be modified based on different selected sets of potentially interfering pulse edges and/or signal patterns, as will be described in more detail below. This may be done for one or more signal lines simultaneously, for one or more signal lines concurrently (e.g., different lines may be on different steps of method 200), and/or for one or more lines sequentially, depending on the implementation.

In some cases, the buffered target data may be a substantially complete representation of the target signal pattern, and may be used as an input to a DAC to output a corresponding analog signal. In other examples, however, the buffered target data may be a relatively sparse representation of the target signal pattern to conserve buffer space, and may be used only for the purposes of identifying potentially interfering signals set to drive other analog signal lines concurrently with driving of the target signal line with the target signal pattern. In such cases, a more detailed digital representation of the target signal pattern may be stored elsewhere (e.g., via other data storage associated with the display controller), and it may be this more detailed digital representation that is modified to preemptively mitigate the interference expected to affect the corresponding analog signal during transmission.

Thus, in general, "target data" stored in a target buffer may include some indication as to the overall temporal length of the target signal pattern—e.g., to enable identification of potentially interfering signal pulses and/or pulse edges that may be used to drive signal lines concurrently with the target pattern. For example, the target data may include indications of timestamps associated with a beginning of the target signal pattern, an end of the target signal pattern, and/or a temporal centroid of the target signal pattern.

In the example of FIG. 4, each of the analog signal lines 108A, 108B, and 108C is also associated with a respective pattern buffer 404A, 404B, and 404C. Each pattern buffer in turn stores pattern data 406A, 406B, and 406C. It will be understood that each pattern buffer may serve as the "target" buffer for its corresponding analog signal line. For instance, when analog signal line 108B is designated as the target signal line—as in, the display controller is attempting to perform preemptive interference mitigation for a target signal pattern set to drive signal line 108B—then any or all of the pattern data stored in pattern buffer 404B may constitute "target data" as described herein.

As will be described in more detail below, driving of the various analog signal lines with signal patterns may not necessarily have synchronized start times, end times, and/or temporal lengths in some implementations, and this can complicate attempts to perform interference mitigation for any given signal pattern. As such, in some cases, the electronic system may populate a pattern buffer for each of the plurality of different analog signal lines with pattern data representing a set of upcoming signal patterns. Notably, the set of buffered patterns represented in each pattern buffer may include any patterns set to drive the corresponding signal line after the one or more upcoming signal patterns represented in the edge data of the edge buffer corresponding to the analog signal line. In other words, pattern data 406A may represent a set of signal patterns set to drive the analog signal line after the one or more patterns represented by edge data 402A stored in edge buffer 400A.

This may beneficially enable the display controller to buffer information for a relatively larger number of upcoming signal patterns without dramatically increasing the size of each edge buffer. For instance, as discussed above, the edge data stored in each edge buffer may use a searchable format, enabling specific pulse edges to be identified regardless of their position within the buffer. However, this can increase the size of the buffer, and/or increase the computational load associated with maintaining and/or searching the buffer, particularly as the size of the buffer increases. Thus, the pattern data stored in each pattern buffer may use a different format that beneficially conserves computational resources. For example, the pattern data may be relatively less detailed than the edge data, and/or may be stored in a non-searchable format. As with the edge buffers, the pattern buffers may in some cases use a FIFO format.

In some cases, the pattern buffers may be analogous to overflow storage for the edge buffers. For example, the display controller may determine that edge data in a particular edge buffer is associated with timestamps falling before a temporal start point of the target signal pattern. In other words, the edge data is so temporally advanced from the target signal pattern that interference is relatively less likely, as transmission of the analog signal corresponding to the pulse edge will occur before transmission of the analog signal corresponding to target signal pattern begins. In some cases, such edge data may be removed to free up buffer space. The removed edge data may be replaced with pattern data representing some to all of an oldest signal pattern stored in the pattern buffer corresponding to a particular analog signal line. In this manner, the oldest edge data may be replaced when it is no longer needed, and replaced with data corresponding to pulse edges of an signal pattern set to drive the signal line in the near future—e.g., enabling the display controller to determine whether the new edge data in the edge buffer corresponds to potentially interfering pulse edges for the target signal pattern.

Returning briefly to FIG. 2, at 208, method 200 includes searching one or more edge buffers corresponding to one or more potentially interfering analog signal lines, different from the target signal line, to identify potentially interfering pulse edges. Notably, potentially interfering pulse edges may include any pulse edges set to drive other analog signal lines concurrently with driving of the target signal line with the target signal pattern.

It will be understood that the display controller need not search every edge buffer corresponding to every other analog signal line. Rather, the searching may in some cases be limited to one or more "potentially interfering" analog signal lines—e.g., those that are physically close enough to the target signal line that transmission of analog signals is likely to have a significant effect on the transmission of the analog signal corresponding to the target signal pattern on the target signal line. For example, the one or more potentially interfering analog signal lines may include a predetermined number of analog signal lines (e.g., four, or another suitable number depending on the implementation) having shortest physical distances from the target signal line. Any signal lines further away from the target signal line than the closest predetermined number of signal lines may be far enough away that any interference is less significant.

However, the specific analog signal lines identified as potentially interfering analog signal lines may be determined in any suitable way. This may be determined, for example, based on testing of an assembled device—e.g., by determining which signal lines are physically close enough to which other lines that significant interference is observed. Depending on the implementation, the number of signal lines identified as potentially interfering may be increased to improve the accuracy of the output signal, or decreased to conserve computational resources.

In general, however, the display controller may search some number of edge buffers, corresponding to some number of potentially interfering analog signal lines, to identify potentially interfering pulse edges set to drive other signal lines concurrently with driving of the target signal line with the target signal pattern. In some cases, this may include generating an interference search window for the target signal pattern. The interference search window may be centered on a temporal centroid of the target signal pattern and have a temporal window length that is equal to or greater than a temporal pattern length of the target signal pattern. For example, the search window may have the same temporal length as the target signal pattern, with some amount of margin before and/or after the target signal pattern to account for non-instantaneous signal response.

Figure 5:
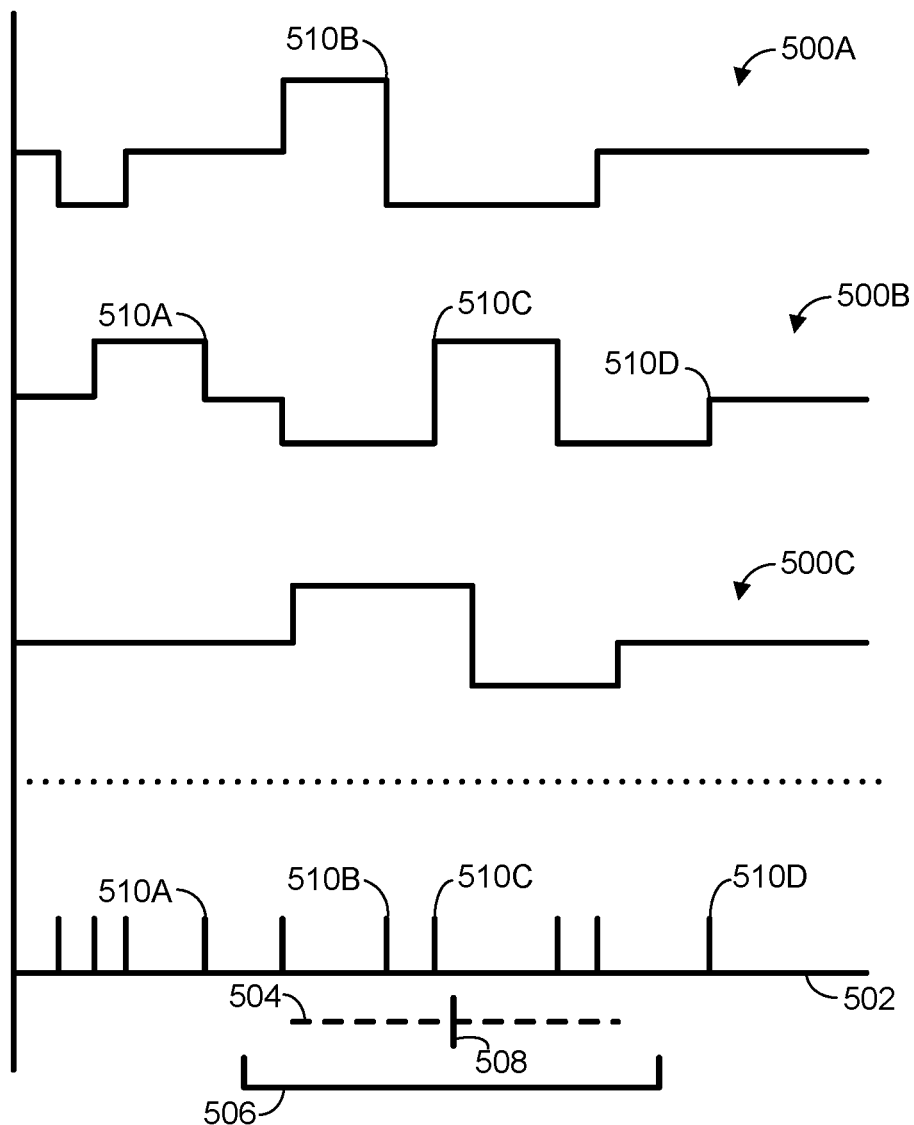
FIG. 5 schematically illustrates searching for potentially interfering pulse edges.

This is illustrated with respect to FIG. 5, which includes representations of three different signal patterns 500A, 500B, and 500C. In this example, signal pattern 500C is the target signal pattern. FIG. 5 also includes a timeline 502 used to indicate the timing of various pulse edges relative to the target signal pattern. The temporal pattern length of the target signal pattern is indicated by a dashed line 504 shown below timeline 502, along with an interference search window 506 that is longer than the temporal pattern length and centered on a temporal centroid 508 of the target signal pattern. The perpendicular lines extending upward from timeline 502 indicate times corresponding to pulse edges of signal patterns 500A and 500B. One or more of these pulse edges may be identified as potentially interfering pulse edges.

In some cases, searching the edge buffers corresponding to the one or more potentially interfering analog signal lines to identify potentially interfering pulse edges may include searching for any pulse edges associated with timestamps falling within the interference search window. For instance, in FIG. 5, four specific pulse edges are labeled as 510A, 510B, 510C, and 510D (these pulse edges are labeled both on timeline 502 and on their corresponding signal patterns 500A and 500B to illustrate the correspondence between the timeline and the signal patterns). The specific labeled pulse edges are chosen arbitrarily for the sake of illustration. As shown, pulse edges 510B and 510C fall within interference search window 506. Thus, these pulse edges (and/or any other pulse edges falling within the interference search window) may be identified as potentially interfering pulse edges. By contrast, pulse edges 510A and 510D are outside the search window, and thus they (and/or any of the other pulse edges falling outside the interference search window) may not be identified as potentially interfering pulse edges.

It will be understood that the timeline example of FIG. 5 is used only for the sake of illustration. In practical examples, "searching" edge buffers of potentially interfering analog signal lines may include searching the actual data structures stored in the edge buffers. In other words, the display controller need not graphically represent timestamps corresponding to pulse edges on a timeline, as is shown in FIG. 5.

Furthermore, with specific regard to pulse edge 510A in FIG. 5, the pulse edge is associated with a timestamp that falls before the beginning of the interference search window. Thus, as discussed above, pulse edge 510A may be relatively older edge data that is set to drive a corresponding signal line before driving of the target signal line with the target signal pattern begins. As such, in some examples, edge data representing pulse edge 510A (and/or any other pulse edges identified as falling before the interference search window) may be removed from its corresponding edge buffer—e.g., to free up buffer space.

Returning briefly to FIG. 2, at 210, method 200 includes selecting a set of one or more of the potentially interfering pulse edges for interference mitigation. In some cases, this may include every pulse edge identified as a potentially interfering pulse edge. However, in other examples, it may not be necessary and/or practical to perform interference mitigation based on every pulse edge that falls within the interference search window. Rather, the display controller may select a subset of those pulse edges that are determined to be most likely to contribute to signal interference.

For example, selecting the set of one or more of the potentially interfering pulse edges may include selecting a predetermined number of potentially interfering pulse edges associated with timestamps that are closest to the temporal centroid of the target signal pattern. To reuse the example of FIG. 5, the display controller may compare the timestamp of each of the pulse edges within interference search window 506 to the time of temporal centroid 508 to identify the pulse edges closest in time to the center of the target search pattern. The specific number of pulse edges selected may vary depending on the implementation. For instance, selecting relatively more pulse edges may potentially improve the accuracy of the output signal, while selecting relatively fewer pulse edges may help to conserve computational resources.

Returning briefly to FIG. 2, at 212, method 200 includes, prior to driving of the target signal line with the target signal pattern, modifying the target signal pattern to perform preemptive interference mitigation based at least in part on the selected set of one or more potentially interfering pulse edges. As discussed above, "modifying" the target signal pattern refers to modifying digital data corresponding to the target signal pattern prior to driving of the target signal line to cause transmission of a corresponding analog signal. In this manner, the actual signal that is ultimately transmitted may differ from the signal that would result from the original, unmodified data—e.g., with the expectation that, after the signal is affected by the anticipated interference, it will be substantially similar to the originally specified signal.

Figure 6:
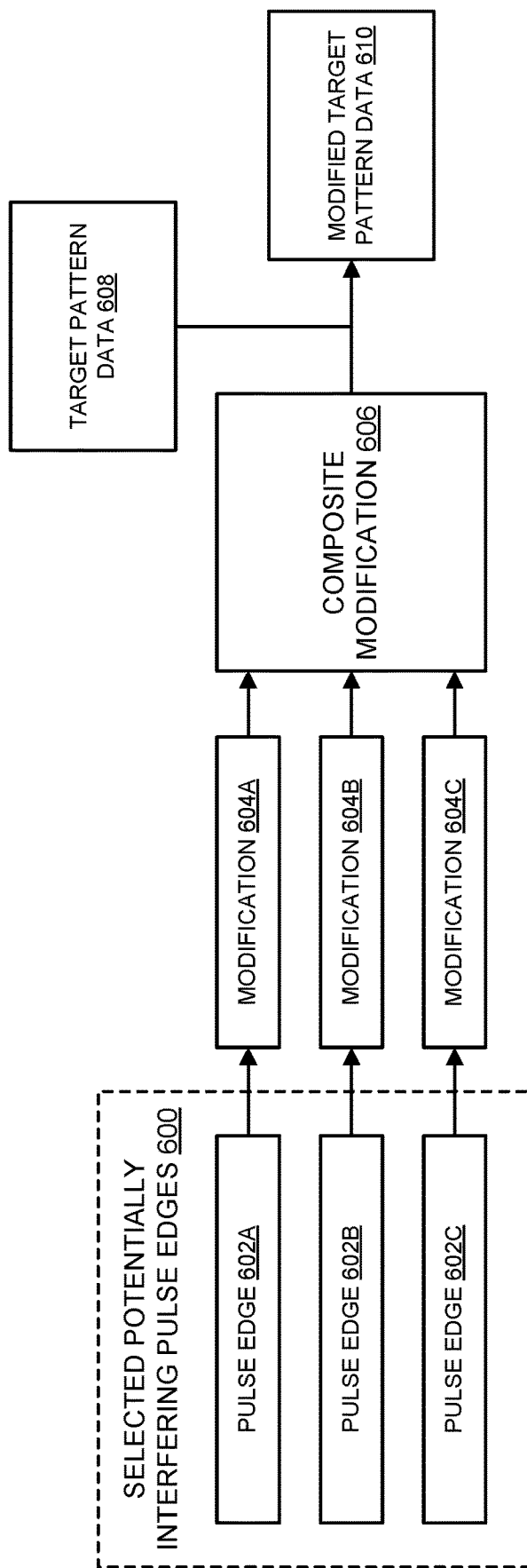
FIG. 6 schematically illustrates modifying a target signal pattern based on potentially interfering pulse edges.

This process is schematically illustrated with respect to FIG. 6. Specifically, FIG. 6 shows a selected set of potentially interfering pulse edges 600, which in this example, includes three different pulse edges 602A, 602B, and 602C. Performing the preemptive interference mitigation may in some cases include identifying different individual modifications corresponding to each potentially interfering pulse edge of the selected set of one or more potentially interfering pulse edges. Thus, in FIG. 6, each of pulse edges 602A-602C is associated with a corresponding modification 604A, 604B, and 604C. From there, each of the different individual modifications may be merged to give a composite modification 606. The composite modification is applied to digital data 608 representing the target signal pattern. This results in modified data 610 representing the target signal pattern, which may be provided to a DAC to cause transmission of a corresponding analog signal.

It will be understood that the specific manner in which the target signal pattern is modified may take any suitable form, and may vary depending on the implementation—e.g., depending on the type of signals transmitted, the purpose of the signals, and the physical construction of the device (e.g., the arrangement of different signal lines with respect to one another). In general, each modification applied to the target signal pattern may be done to mitigate (e.g., counteract) interference anticipated to be caused by a corresponding pulse edge during transmission of analog signals. For example, if it is expected that a pulse edge used to drive one line may cause a decrease in signal amplitude at the target signal line, then the modification used may increase the signal amplitude by a similar amount. In this manner, once the interference occurs, the resulting analog signal may be substantially similar to the analog signal originally specified by the target signal pattern before modification.

In some cases, the magnitude of the applied modification for any given pulse edge may be based at least in part on the magnitude of the change in analog signal associated with the pulse edge. Additionally, or alternatively, each applied modification may be based at least in part on a temporal difference between a timestamp of the selected pulse edge and the temporal centroid of the target signal pattern. For example, as discussed above, the edge buffer for each analog signal line may in some cases store data for each upcoming pulse edge specifying the magnitude of the signal change associated with the pulse edge and/or a timestamp associated with the pulse edge. Thus, any or all of this data may be used during interference mitigation.

In some cases, the specific modification applied to the target signal pattern may be context-dependent. For example, the specific modifications applied may depend on environmental temperature, lighting conditions, the specific hardware used within the device (e.g., a cable with known signal transmission properties), the specific content currently presented by a display system (e.g., a specific application such as a video game), etc. However, it will be understood that the present disclosure is primarily concerned with techniques for identifying potentially interfering pulse edges and/or signal patterns in a computationally efficient manner. The specific modifications applied to a target signal pattern after the potential interference is identified may take any suitable form, depending on the implementation.

Figure 7A:
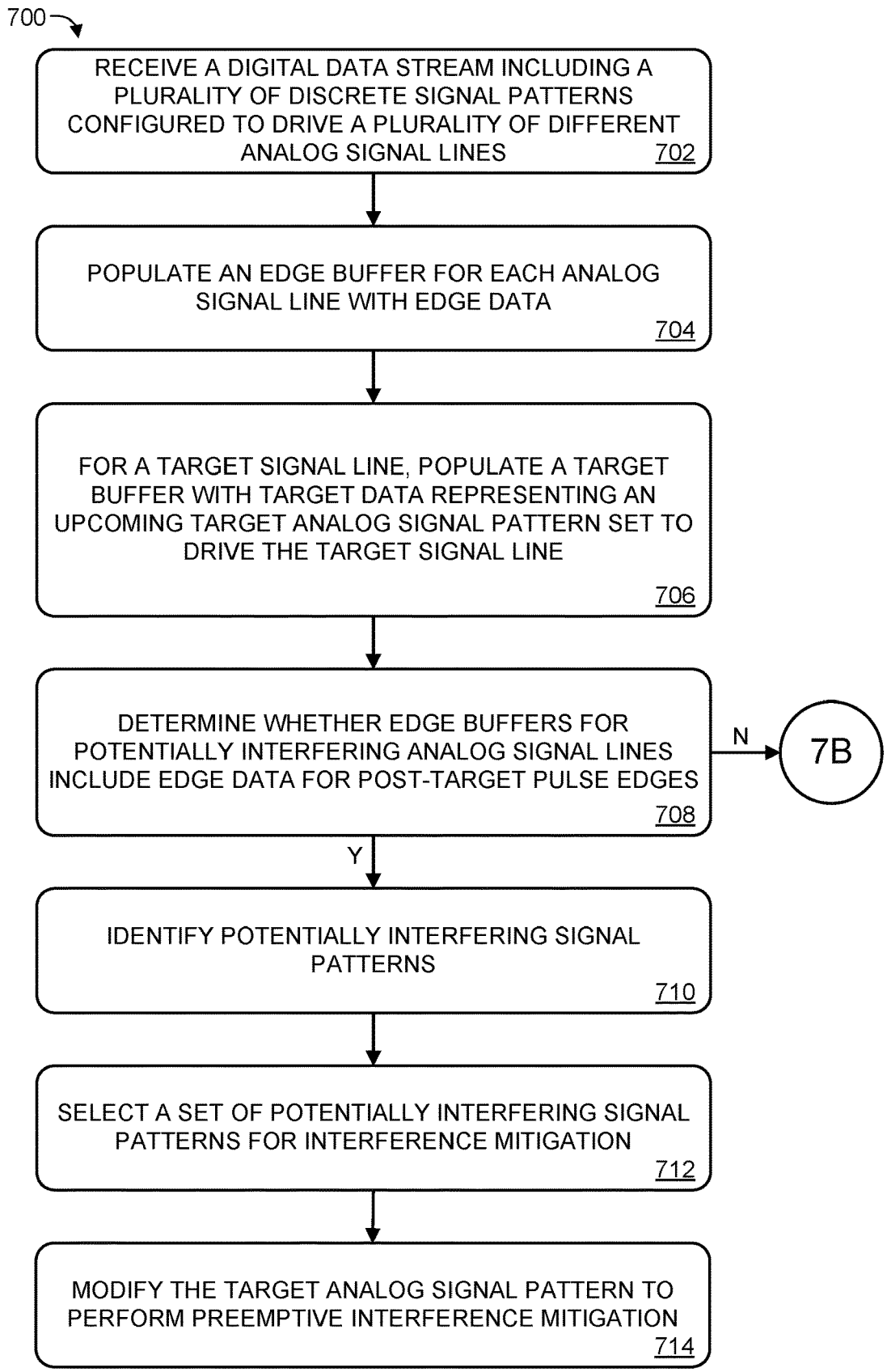
FIGS. 7A and 7B illustrate another example method for mitigating interference across analog signal lines.
Figure 7B:
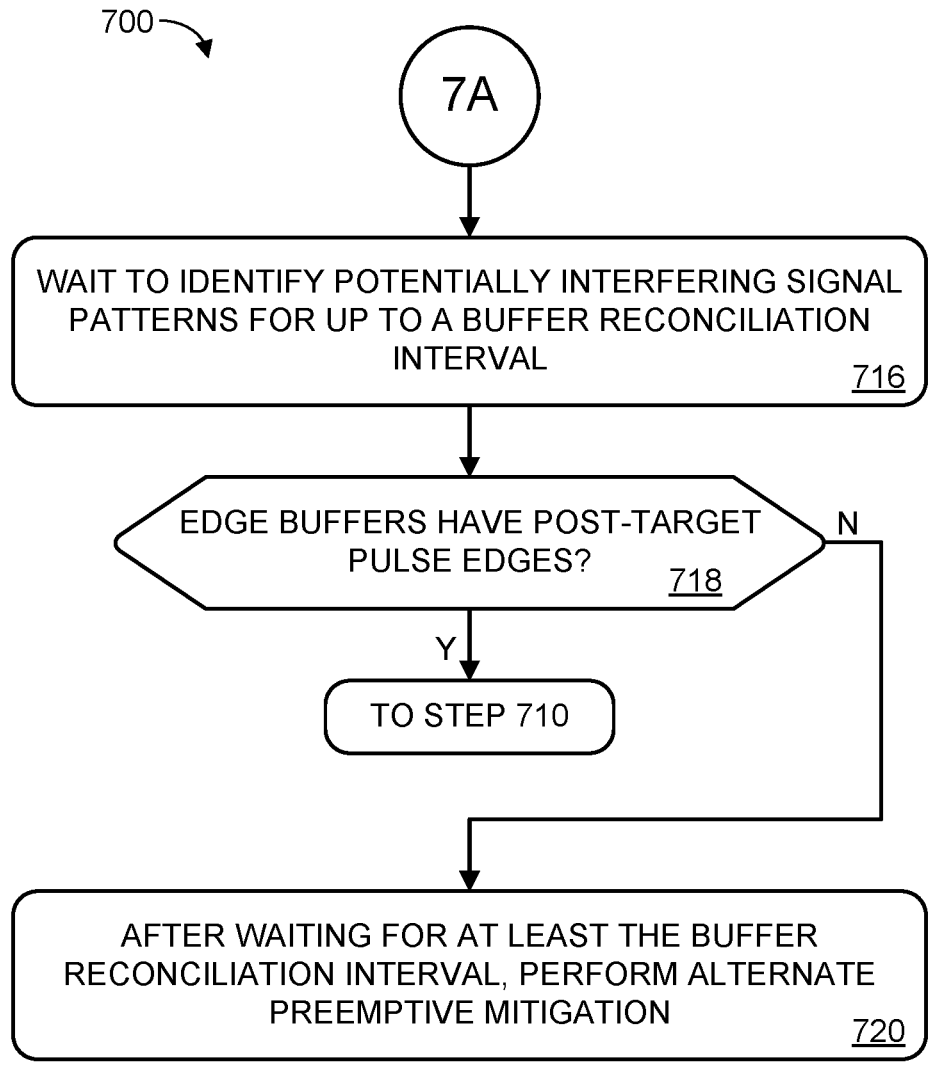

Method 200 is primarily described with the assumption that the start times of the various signal patterns used to drive the various analog signal lines are synchronized. However, this may not always be the case in all implementations. Accordingly, FIGS. 7A and 7B illustrate another example method 700 for mitigating interference across analog signal lines. As with method 200, method 700 may be implemented by any suitable computing system of one or more computing devices. For example, method 700 may be implemented by display controller 100 of electronic display system 101. In general, any computing device(s) implementing method 700 may have any suitable capabilities, form factor, and hardware configuration. In some cases, method 700 may be implemented by computing system 900 described below with respect to FIG. 9.

It will be understood that methods 200 and 700 are not mutually exclusive. In other words, any or all of the techniques described above with respect to method 200 may similarly be applied to method 700, and/or any of the techniques described for method 700 may be applied to method 200. In some cases, a hybrid approach combining aspects of methods 200 and 700 may be used.

At 702, method 700 includes receiving a digital data stream including a plurality of discrete signal patterns configured to drive a plurality of different analog signal lines, each signal pattern comprising two or more signal pulses bounded by corresponding pulse edges. At 704, method 700 includes, for each of the plurality of different analog signal lines, populating an edge buffer corresponding to the analog signal line with edge data representing pulse edges of one or more upcoming signal patterns set to drive the analog signal line. At 706, method 700 includes, for a target signal line of the plurality of analog signal lines, populating a target buffer with target data representing an upcoming target signal pattern set to drive the target signal line. Each of these may be done in substantially the same way as steps 202, 204, and 206 described above with respect to method 200.

Continuing with method 700, at 708, the method includes, for one or more edge buffers corresponding to one or more potentially interfering analog signal lines, determining whether each of the one or more edge buffers includes edge data corresponding to one or more post-target pulse edges associated with timestamps falling after a temporal endpoint of the target signal pattern. As discussed above, for the purposes of method 700, it is not assumed that each of the signal patterns corresponding to different analog signal lines have synchronized start times. Thus, it is possible that, at the time target data for a target signal pattern is buffered, edge data for potentially interfering pulse edges has not yet been buffered. Thus, step 708 may be described as checking whether the edge buffers corresponding to the potentially interfering analog signal lines are up to date. If such edge buffers include edge data for post-target pulse edges, then they are at least caught up to the target analog signal line. However, any edge buffers that do not include post-target pulse edges may not yet be up to date with the target signal line, and thus the system may wait some length of time before attempting to perform interference mitigation, as will be described in more detail below.

Figure 8A:
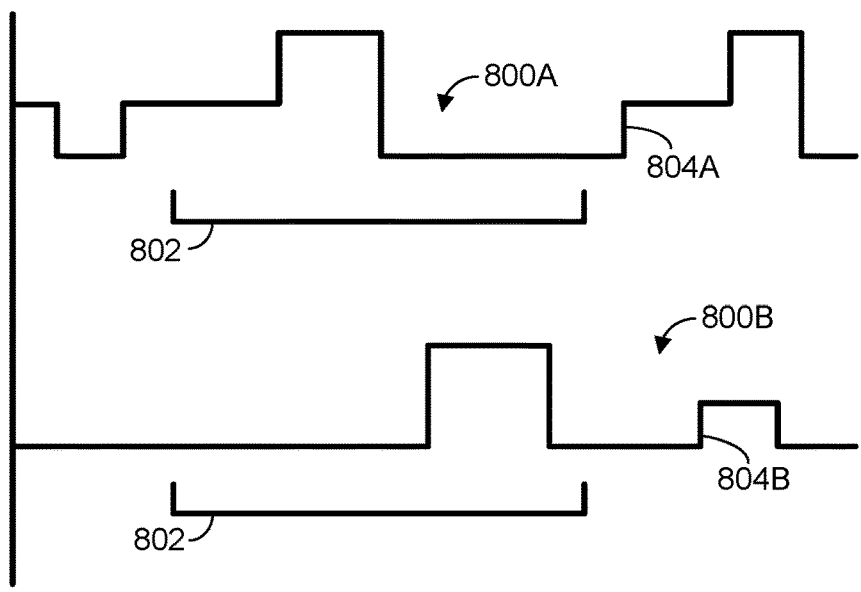
FIGS. 8A and 8B schematically illustrate selecting potentially interfering signal patterns.

This is schematically illustrated with respect to FIG. 8A, which includes representations of two potentially interfering signal patterns 800A and 800B. An interference search window 802 generated for a target signal pattern is shown relative to each potentially interfering analog search pattern. In the example of FIG. 8A, each of patterns 800A and 800B include post-target pulse edges (pulse edge 804A in pattern 800A, and pulse edge 804B in pattern 800B) set to drive their respective signal lines after the temporal endpoint of the target signal pattern (as indicated by pulse edges 804A and 804B falling after the interference search window 802). In other words, edge buffers corresponding to the analog signal lines set to transmit patterns 800A and 800B include edge data relating to pulse edges that will be used to drive corresponding signal lines after the target signal pattern. As such, in the example of FIG. 8A, each of the potentially interfering analog signal lines include post-target pulse edges in their associated edge buffers.

Returning briefly to FIG. 7A, if YES at step 708, the method proceeds to step 710. At 710, method 700 includes, based at least in part on determining that each of the one or more edge buffers corresponding to the one or more potentially interfering analog signal lines includes edge data corresponding to the one or more post-target pulse edges, identifying one or more potentially interfering signal patterns set to drive the one or more potentially interfering analog signal lines concurrently with driving of the target signal line with the target signal pattern.

Notably, in contrast to approach described above with respect to method 200, method 700 involves identifying potentially interfering signal patterns, rather than individual potentially interfering pulse edges. This may beneficially conserve computational resources by reducing the number of comparison operations performed. For instance, edge data in the edge buffers may be tagged with the signal pattern that the edge data for each pulse edge corresponds to, as well as a temporal centroid of the signal pattern. As such, rather than perform a relatively large number of edge-to-centroid comparisons between the temporal centroid of the target signal pattern and a plurality of different pulse edges, the system may perform relatively fewer centroid-to-centroid comparisons between the target signal pattern and one or more other signal patterns. By identifying one or more analog patterns that may be used to drive corresponding signal lines concurrently with driving of the target signal line with the target signal pattern, the system may more quickly identify a specific set of pulse edges (e.g., corresponding to the identified signal patterns) that may potentially cause interference. Any pulse edges that do not actually fall within an interference search window of the target signal pattern may be filtered in a secondary step.

Figure 8B:
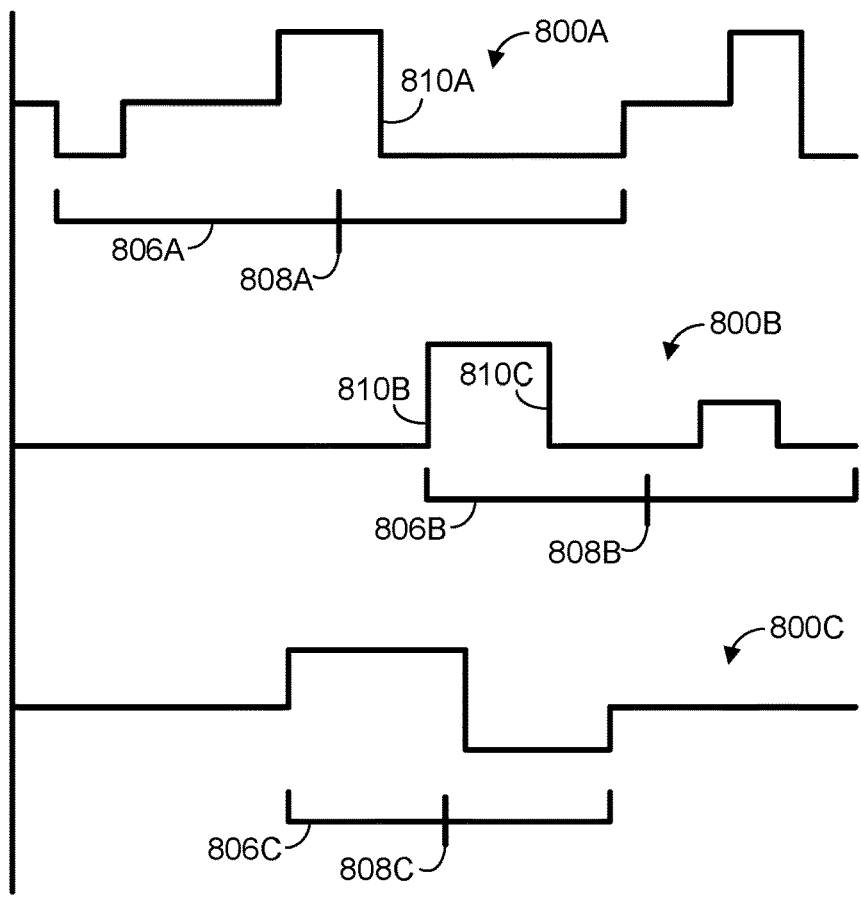

This is schematically illustrated with respect to FIG. 8B, which again shows potentially interfering signal patterns 800A and 800B, in comparison to a target signal pattern 800C. In FIG. 8B, each of patterns 800A, 800B, and 800C are shown with corresponding temporal lengths 806A, 806B, and 806C (the signal pulses shown occurring after temporal length 806A correspond to pulses of a separate signal pattern used to drive the same signal line after signal pattern 800A). The temporal centroids of each pattern are given by centroids 808A, 808B, and 808C shown on the different temporal length indicators. In FIG. 8B, both of patterns 800A and 800B overlap with target signal pattern 800C, and thus each of patterns 800A and 800B may be identified as potentially interfering signal patterns.

Returning briefly to FIG. 7A, at 712, method 200 includes selecting a set of the one or more potentially interfering signal patterns for interference mitigation. Again, this may in some cases include selecting a predetermined number of potentially interfering signal patterns. Selecting relatively more patterns may improve the accuracy of the signal output, while selecting relatively fewer patterns may conserve computational resources. The specific patterns that are selected may in some cases include the potentially interfering signal patterns having temporal centroids with shortest temporal distances from a temporal centroid of the target signal pattern. For example, returning to FIG. 8B, the display controller may compare the temporal centroid 808C of target pattern 800C to centroids 808A and 808B of patterns 800A and 800B. From there, the display controller may select pattern 800A but not pattern 800B, as one example, because the temporal centroid of pattern 800A is closer to the temporal centroid of the target signal pattern.

Returning briefly to FIG. 7A, at 714, method 700 includes, prior to driving of the target signal line with the target signal pattern, modifying the target signal pattern to perform preemptive interference mitigation based at least in part on the selected set of the one or more potentially interfering signal patterns. As discussed above, the specific modification applied to the target signal pattern may take any suitable form. In some cases, performing the preemptive interference mitigation may include identifying one or more potentially interfering pulse edges within the selected set of the one or more potentially interfering signal patterns. For instance, as discussed above, the system may beneficially reduce the number of comparison operations performed by first comparing centroid-to-centroid differences between the target signal pattern and any potentially interfering signal patterns. Any pulse edges corresponding to a selected signal pattern may in some cases be filtered in a secondary step to determine which pulse edges are actually likely to cause interference—e.g., the display controller may identify pulse edges falling within an interference search window centered on a temporal centroid of the target signal pattern. Once these potentially interfering pulse edges are identified, the target signal pattern may be modified substantially as described above with respect to FIG. 6.

Returning briefly to step 708 of method 700, in some cases, not all of the edge buffers corresponding to the potentially interfering analog signal lines will include edge data corresponding to post-target pulse edges. In such cases (e.g., NO at 708), method 700 proceeds to step 716 shown in FIG. 7B. At 716, method 700 includes, based at least in part on determining that at least one of the one or more edge buffers corresponding to the one or more potentially interfering analog signal lines does not yet include edge data corresponding to the one or more post-target pulse edges, waiting to identify the one or more potentially interfering signal patterns for up to a buffer reconciliation interval. This may, for instance, allow any edge buffers not up to date with the target analog signal line time to catch up and buffer any edge data for pulse edges that may potentially interfere with the target signal pattern.

The buffer reconciliation interval may have any suitable length depending on the implementation. In general, increasing the buffer reconciliation interval may increase the chances that a full interference mitigation can be applied to the target signal pattern prior driving the target signal line, thereby increasing the accuracy of the output signal. However, in the case that one or more analog signal lines are significantly out of synchronization with others of the analog signal lines, then increasing the buffer reconciliation interval can potentially stall the system by waiting an excessive length of time for edge data to be buffered. Thus, depending on the implementation, any suitable length may be used for the buffer reconciliation interval to balance these considerations.

Continuing with method 700, at 718, the method includes again checking whether each of the one or more edge buffers corresponding to the one or more potentially interfering analog signal lines includes edge data for post-target pulse edges. This check may occur any number of times (e.g., at fixed or variable time intervals) during the buffer reconciliation interval. If YES at 718, then each of the edge buffers for the one or more potentially interfering analog signal lines are up to date with respect to the target analog signal line. Thus, method 700 may proceed to step 710 and proceed as described above.

However, if NO at 718, method 700 proceeds to 720. At 720, the method includes, after waiting for at least the buffer reconciliation interval and determining that at least one of the one or more edge buffers corresponding to the one or more potentially interfering analog signal lines still does not include edge data corresponding to the one or more post-target edge pulses, performing an alternate preemptive interference mitigation for the target signal pattern. In other words, in order to avoid stalling transmission of analog signals by waiting too long for a particular edge buffer to be updated, the system may attempt to perform a "best guess" interference mitigation for the target signal pattern based on the information available at the time. For example, in a case where the one or more potentially interfering analog signal lines includes at least two potentially interfering analog signal lines, the alternate preemptive interference mitigation may be based at least in part on potentially interfering signal patterns identified for less than all of the at least two potentially interfering analog signal lines. In other cases, the alternate preemptive interference mitigation may take another suitable form.

The methods and processes described herein may be tied to a computing system of one or more computing devices. In particular, such methods and processes may be implemented as an executable computer-application program, a network-accessible computing service, an application-programming interface (API), a library, or a combination of the above and/or other compute resources.

Figure 9:
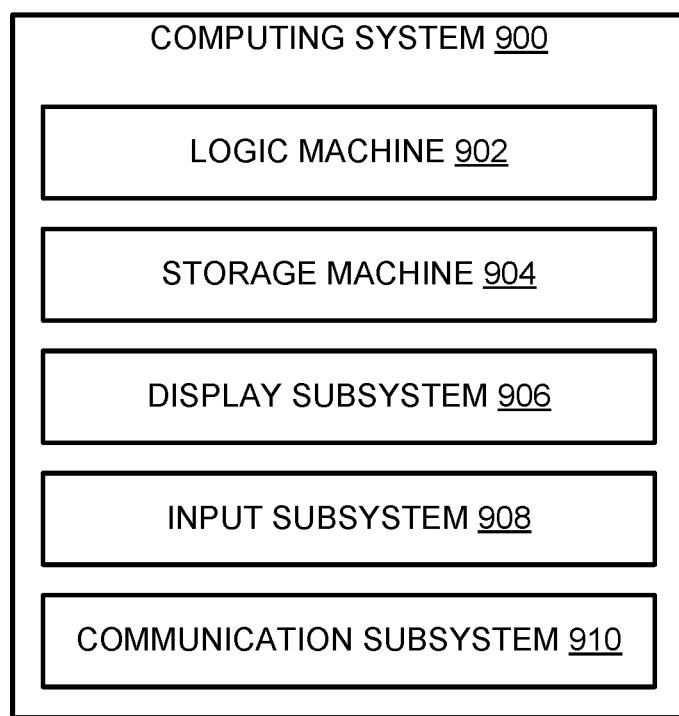
FIG. 9 schematically shows an example computing system.

FIG. 9 schematically shows a simplified representation of a computing system 900 configured to provide any to all of the compute functionality described herein. Computing system 900 may take the form of one or more personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices.

Computing system 900 includes a logic subsystem 902 and a storage subsystem 904. Computing system 900 may optionally include a display subsystem 906, input subsystem 908, communication subsystem 910, and/or other subsystems not shown in FIG. 9.

Logic subsystem 902 includes one or more physical devices configured to execute instructions. For example, the logic subsystem may be configured to execute instructions that are part of one or more applications, services, or other logical constructs. The logic subsystem may include one or more hardware processors configured to execute software instructions. Additionally, or alternatively, the logic subsystem may include one or more hardware or firmware devices configured to execute hardware or firmware instructions. Processors of the logic subsystem may be single-core or multi-core, and the instructions executed thereon may be configured for sequential, parallel, and/or distributed processing. Individual components of the logic subsystem optionally may be distributed among two or more separate devices, which may be remotely located and/or configured for coordinated processing. Aspects of the logic subsystem may be virtualized and executed by remotely-accessible, networked computing devices configured in a cloud-computing configuration.

Storage subsystem 904 includes one or more physical devices configured to temporarily and/or permanently hold computer information such as data and instructions executable by the logic subsystem. When the storage subsystem includes two or more devices, the devices may be collocated and/or remotely located. Storage subsystem 904 may include volatile, nonvolatile, dynamic, static, read/write, read-only, random-access, sequential-access, location-addressable, file-addressable, and/or content-addressable devices. Storage subsystem 904 may include removable and/or built-in devices. When the logic subsystem executes instructions, the state of storage subsystem 904 may be transformed—e.g., to hold different data.

Aspects of logic subsystem 902 and storage subsystem 904 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem and the storage subsystem may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices.

When included, display subsystem 906 may be used to present a visual representation of data held by storage subsystem 904. This visual representation may take the form of a graphical user interface (GUI). Display subsystem 906 may include one or more display devices utilizing virtually any type of technology. In some implementations, display subsystem may include one or more virtual-, augmented-, or mixed reality displays.

When included, input subsystem 908 may comprise or interface with one or more input devices. An input device may include a sensor device or a user input device. Examples of user input devices include a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition.

When included, communication subsystem 910 may be configured to communicatively couple computing system 900 with one or more other computing devices. Communication subsystem 910 may include wired and/or wireless communication devices compatible with one or more different communication protocols. The communication subsystem may be configured for communication via personal-, local- and/or wide-area networks.

This disclosure is presented by way of example and with reference to the associated drawing figures. Components, process steps, and other elements that may be substantially the same in one or more of the figures are identified coordinately and are described with minimal repetition. It will be noted, however, that elements identified coordinately may also differ to some degree. It will be further noted that some figures may be schematic and not drawn to scale. The various drawing scales, aspect ratios, and numbers of components shown in the figures may be purposely distorted to make certain features or relationships easier to see.

In an example, a method for mitigating interference across analog signal lines comprises: receiving a digital data stream including a plurality of discrete signal patterns configured to drive a plurality of different analog signal lines, each signal pattern comprising two or more signal pulses bounded by corresponding pulse edges; for each of the plurality of different analog signal lines, populating an edge buffer corresponding to the analog signal line with edge data representing pulse edges of one or more upcoming signal patterns set to drive the analog signal line; for a target signal line of the plurality of different analog signal lines, populating a target buffer with target data representing a target signal pattern set to drive the target signal line; searching one or more edge buffers corresponding to one or more potentially interfering analog signal lines, different from the target signal line, to identify potentially interfering pulse edges set to drive the one or more potentially interfering analog signal lines concurrently with the target signal pattern driving the target signal line; selecting a set of one or more of the potentially interfering pulse edges for interference mitigation; and prior to driving of the target signal line with the target signal pattern, modifying the target signal pattern to perform preemptive interference mitigation based at least in part on the selected set of one or more potentially interfering pulse edges. In this example or any other example, the method further comprises performing preemptive interference mitigation for each of the plurality of different analog signal lines by separately identifying each of the plurality of different analog signal lines as the target signal line, and modifying different respective target signal patterns for each of the plurality of different analog signal lines based on different selected sets of potentially interfering pulse edges. In this example or any other example, performing the preemptive interference mitigation includes identifying different individual modifications corresponding to each potentially interfering pulse edge of the selected set of one or more potentially interfering pulse edges, merging each of the different individual modifications to give a composite modification, and applying the composite modification to the target signal pattern. In this example or any other example, the one or more potentially interfering analog signal lines includes a predetermined number of analog signal lines having shortest physical distances from the target signal line. In this example or any other example, the method further comprises generating an interference search window for the target signal pattern, the interference search window centered on a temporal centroid of the target signal pattern and having a temporal window length that is equal to or greater than a temporal pattern length of the target signal pattern. In this example or any other example, searching the one or more edge buffers corresponding to the one or more potentially interfering analog signal lines to identify potentially interfering pulse edges includes searching for any pulse edges associated with timestamps falling within the interference search window. In this example or any other example, selecting the set of one or more of the potentially interfering pulse edges includes selecting a predetermined number of potentially interfering pulse edges associated with timestamps that are closest to the temporal centroid of the target signal pattern. In this example or any other example, the method further comprises removing, from the one or more edge buffers, any edge data representing pulse edges associated with timestamps falling before a beginning of the interference search window. In this example or any other example, the edge data stored in each edge buffer comprises, for pulse edges of each of the one or more upcoming signal patterns set to drive the analog signal line corresponding to the edge buffer, a timestamp associated with the pulse edge and a signal magnitude change associated with the pulse edge. In this example or any other example, each edge buffer has a maximum size derived at least in part from a maximum supported pulse width and a minimum supported pulse width. In this example or any other example, the digital data stream is a representation of a digital image, and wherein the plurality of discrete signal patterns are used to control a plurality of light emitters to display pixels of the digital image.

In an example, an electronic display system comprises: a display controller configured to: receive a digital data stream including a plurality of discrete signal patterns configured to drive a plurality of different analog signal lines, the plurality of signal patterns useable to control a plurality of light emitters to display pixels of a digital image represented by the digital data stream, and each signal pattern comprising two or more signal pulses bounded by corresponding pulse edges; for each of the plurality of different analog signal lines, populate an edge buffer corresponding to the analog signal line with edge data representing pulse edges of one or more upcoming signal patterns set to drive the analog signal line; for a target signal line of the plurality of different analog signal lines, populate a target buffer with target data representing a target signal pattern set to drive the target signal line; search one or more edge buffers corresponding to one or more potentially interfering analog signal lines, different from the target signal line, to identify potentially interfering pulse edges set to drive the one or more potentially interfering analog signal lines concurrently with the target signal pattern driving the target signal line; select a set of one or more of the potentially interfering pulse edges for interference mitigation; and prior to driving the target signal line with the target signal pattern, modify the target signal pattern to perform preemptive interference mitigation based at least in part on the selected set of one or more potentially interfering pulse edges. In this example or any other example, the display controller is further configured to perform preemptive interference mitigation for each of the plurality of different analog signal lines by separately identifying each of the plurality of different analog signal lines as the target signal line, and modifying different respective target signal patterns for each of the plurality of different analog signal lines based on different selected sets of potentially interfering pulse edges. In this example or any other example, the one or more potentially interfering analog signal lines includes a predetermined number of analog signal lines having shortest physical distances from the target signal line. In this example or any other example, the display controller is further configured to generate an interference search window for the target signal pattern, the interference search window centered on a temporal centroid of the target signal pattern and having a temporal window length that is equal to or greater than a temporal pattern length of the target signal pattern. In this example or any other example, selecting the set of one or more of the potentially interfering pulse edges includes selecting a predetermined number of potentially interfering pulse edges associated with timestamps that are closest to the temporal centroid of the target signal pattern. In this example or any other example, the display controller is further configured to remove, from the one or more edge buffers, any edge data representing pulse edges associated with timestamps falling before a beginning of the interference search window. In this example or any other example, the edge data stored in each edge buffer comprises, for pulse edges of each of the one or more upcoming signal patterns to be transmitted over the analog signal line corresponding to the edge buffer, a timestamp associated with the pulse edge and a signal magnitude change associated with the pulse edge. In this example or any other example, each edge buffer has a maximum size derived at least in part from a maximum supported pulse width and a minimum supported pulse width of the electronic display system.

In an example, a method for mitigating interference across analog signal lines comprises: receiving a digital data stream including a plurality of discrete signal patterns configured to drive a plurality of different analog signal lines, the plurality of signal patterns useable to control a plurality of light emitters to display pixels of a digital image represented by the digital data stream, and each signal pattern comprising two or more signal pulses bounded by corresponding pulse edges; for each of the plurality of different analog signal lines, populating an edge buffer corresponding to the analog signal line with edge data representing pulse edges of one or more upcoming signal patterns set to drive the analog signal line; for a target signal line of the plurality of different analog signal lines, populating a target buffer with target data representing a target signal pattern set to drive the target signal line; searching edge buffers corresponding to a predetermined number of potentially interfering analog signal lines having shortest physical distances from the target signal line to identify potentially interfering pulse edges set to drive the predetermined number of potentially interfering analog signal lines concurrently with the target signal pattern driving the target signal line; selecting a set of one or more of the potentially interfering pulse edges for interference mitigation; and prior driving of the target signal line with the target signal pattern, modifying the target signal pattern to perform preemptive interference mitigation based at least in part on the selected set of one or more potentially interfering pulse edges.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for mitigating interference across analog signal lines, the method comprising:
receiving a digital data stream including a plurality of discrete signal patterns configured to drive a plurality of different analog signal lines, each signal pattern comprising two or more signal pulses bounded by corresponding pulse edges;

for each of the plurality of different analog signal lines, populating an edge buffer corresponding to the analog signal line with edge data representing pulse edges of one or more upcoming signal patterns set to drive the analog signal line;

for a target signal line of the plurality of different analog signal lines, populating a target buffer with target data representing a target signal pattern set to drive the target signal line;

searching one or more edge buffers corresponding to one or more potentially interfering analog signal lines, different from the target signal line, to identify potentially interfering pulse edges set to drive the one or more potentially interfering analog signal lines concurrently with the target signal pattern driving the target signal line;

selecting a set of one or more of the potentially interfering pulse edges for interference mitigation; and prior to driving of the target signal line with the target signal pattern, modifying the target signal pattern to perform preemptive interference mitigation based at least in part on the selected set of one or more potentially interfering pulse edges.

2. The method of claim 1, further comprising performing preemptive interference mitigation for each of the plurality of different analog signal lines by separately identifying each of the plurality of different analog signal lines as the target signal line, and modifying different respective target signal patterns for each of the plurality of different analog signal lines based on different selected sets of potentially interfering pulse edges.

3. The method of claim 1, wherein performing the preemptive interference mitigation includes identifying different individual modifications corresponding to each potentially interfering pulse edge of the selected set of one or more potentially interfering pulse edges, merging each of the different individual modifications to give a composite modification, and applying the composite modification to the target signal pattern.

4. The method of claim 1, wherein the one or more potentially interfering analog signal lines includes a predetermined number of analog signal lines having shortest physical distances from the target signal line.

5. The method of claim 1, wherein the method further comprises generating an interference search window for the target signal pattern, the interference search window centered on a temporal centroid of the target signal pattern and having a temporal window length that is equal to or greater than a temporal pattern length of the target signal pattern.

6. The method of claim 5, wherein searching the one or more edge buffers corresponding to the one or more potentially interfering analog signal lines to identify potentially interfering pulse edges includes searching for any pulse edges associated with timestamps falling within the interference search window.

7. The method of claim 6, wherein selecting the set of one or more of the potentially interfering pulse edges includes selecting a predetermined number of potentially interfering pulse edges associated with timestamps that are closest to the temporal centroid of the target signal pattern.

8. The method of claim 5, further comprising removing, from the one or more edge buffers, any edge data representing pulse edges associated with timestamps falling before a beginning of the interference search window.

9. The method of claim 1, wherein the edge data stored in each edge buffer comprises, for pulse edges of each of the one or more upcoming signal patterns set to drive the analog signal line corresponding to the edge buffer, a timestamp associated with the pulse edge and a signal magnitude change associated with the pulse edge.

10. The method of claim 1, wherein each edge buffer has a maximum size derived at least in part from a maximum supported pulse width and a minimum supported pulse width.

11. The method of claim 1, wherein the digital data stream is a representation of a digital image, and wherein the plurality of discrete signal patterns are used to control a plurality of light emitters to display pixels of the digital image.

12. An electronic display system, comprising:
a display controller configured to:
receive a digital data stream including a plurality of discrete signal patterns configured to drive a plurality of different analog signal lines, the plurality of signal patterns useable to control a plurality of light emitters to display pixels of a digital image represented by the digital data stream, and each signal pattern comprising two or more signal pulses bounded by corresponding pulse edges;

for each of the plurality of different analog signal lines, populate an edge buffer corresponding to the analog signal line with edge data representing pulse edges of one or more upcoming signal patterns set to drive the analog signal line;

for a target signal line of the plurality of different analog signal lines, populate a target buffer with target data representing a target signal pattern set to drive the target signal line;

search one or more edge buffers corresponding to one or more potentially interfering analog signal lines, different from the target signal line, to identify potentially interfering pulse edges set to drive the one or more potentially interfering analog signal lines concurrently with the target signal pattern driving the target signal line;

select a set of one or more of the potentially interfering pulse edges for interference mitigation; and prior to driving the target signal line with the target signal pattern, modify the target signal pattern to perform preemptive interference mitigation based at least in part on the selected set of one or more potentially interfering pulse edges.

13. The electronic display system of claim 12, wherein the display controller is further configured to perform preemptive interference mitigation for each of the plurality of different analog signal lines by separately identifying each of the plurality of different analog signal lines as the target signal line, and modifying different respective target signal patterns for each of the plurality of different analog signal lines based on different selected sets of potentially interfering pulse edges.

14. The electronic display system of claim 12, wherein the one or more potentially interfering analog signal lines includes a predetermined number of analog signal lines having shortest physical distances from the target signal line.

15. The electronic display system of claim 12, wherein the display controller is further configured to generate an interference search window for the target signal pattern, the interference search window centered on a temporal centroid of the target signal pattern and having a temporal window length that is equal to or greater than a temporal pattern length of the target signal pattern.

16. The electronic display system of claim 15, wherein selecting the set of one or more of the potentially interfering pulse edges includes selecting a predetermined number of potentially interfering pulse edges associated with timestamps that are closest to the temporal centroid of the target signal pattern.

17. The electronic display system of claim 12, wherein the display controller is further configured to remove, from the one or more edge buffers, any edge data representing pulse edges associated with timestamps falling before a beginning of the interference search window.

18. The electronic display system of claim 12, wherein the edge data stored in each edge buffer comprises, for pulse edges of each of the one or more upcoming signal patterns to be transmitted over the analog signal line corresponding to the edge buffer, a timestamp associated with the pulse edge and a signal magnitude change associated with the pulse edge.

19. The electronic display system of claim 12, wherein each edge buffer has a maximum size derived at least in part from a maximum supported pulse width and a minimum supported pulse width of the electronic display system.

20. A method for mitigating interference across analog signal lines, the method comprising:
- receiving a digital data stream including a plurality of discrete signal patterns configured to drive a plurality of different analog signal lines, the plurality of signal patterns useable to control a plurality of light emitters to display pixels of a digital image represented by the digital data stream, and each signal pattern comprising two or more signal pulses bounded by corresponding pulse edges;
- for each of the plurality of different analog signal lines, populating an edge buffer corresponding to the analog signal line with edge data representing pulse edges of one or more upcoming signal patterns set to drive the analog signal line;
- for a target signal line of the plurality of different analog signal lines, populating a target buffer with target data representing a target signal pattern set to drive the target signal line;
- searching edge buffers corresponding to a predetermined number of potentially interfering analog signal lines having shortest physical distances from the target signal line to identify potentially interfering pulse edges set to drive the predetermined number of potentially interfering analog signal lines concurrently with the target signal pattern driving the target signal line;
- selecting a set of one or more of the potentially interfering pulse edges for interference mitigation; and
- prior driving of the target signal line with the target signal pattern, modifying the target signal pattern to perform preemptive interference mitigation based at least in part on the selected set of one or more potentially interfering pulse edges.

* * * * *